United States Patent
Lin et al.

(10) Patent No.: US 9,967,996 B2
(45) Date of Patent: May 8, 2018

(54) SERVER CHASSIS

(71) Applicant: Super Micro Computer Inc., San Jose, CA (US)

(72) Inventors: Ken-Sheng Lin, San Jose, CA (US); Shihhsing Chien, San Jose, CA (US); Richard S. Chen, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 0 days. days.

(21) Appl. No.: 15/276,612

(22) Filed: Sep. 26, 2016

(65) Prior Publication Data

US 2018/0092236 A1 Mar. 29, 2018

(51) Int. Cl.
*H05K 7/14* (2006.01)
*A47B 96/07* (2006.01)
*A47B 88/16* (2006.01)

(52) U.S. Cl.
CPC ........... *H05K 7/1489* (2013.01); *A47B 88/16* (2013.01); *A47B 96/07* (2013.01)

(58) Field of Classification Search
CPC ....... H05K 7/1489; G06F 1/187; A47B 96/07; A47B 88/16; A47B 96/067; G11B 33/022; G11B 33/124
See application file for complete search history.

(56) References Cited

U.S. PATENT DOCUMENTS

| | | | | |
|---|---|---|---|---|
| 2,277,703 A | * | 3/1942 | Kennedy | A47B 88/49 312/334.8 |
| 2,760,803 A | * | 8/1956 | Solomon | E05B 85/08 292/1 |
| 2,809,086 A | * | 10/1957 | Fall | H05K 7/1421 126/340 |
| 4,423,914 A | * | 1/1984 | Vander Ley | A47B 88/493 312/333 |
| 6,209,979 B1 | * | 4/2001 | Fall | H05K 7/1489 312/319.1 |
| 6,938,967 B2 | * | 9/2005 | Dubon | H05K 7/1421 312/330.1 |
| 7,604,307 B2 | * | 10/2009 | Greenwald | A47B 88/49 312/333 |
| 7,661,778 B2 | * | 2/2010 | Yang | H05K 7/1489 312/333 |
| 8,403,433 B2 | * | 3/2013 | Chen | H05K 7/1489 312/333 |

\* cited by examiner

*Primary Examiner* — Ko H Chan
(74) *Attorney, Agent, or Firm* — Chun-Ming Shih; HDLS IPR Services

(57) ABSTRACT

A server chassis includes a tray, two inner rails and two outer rails. The tray includes a bottom plate. Two opposite side walls extend from an edge of the bottom plate. A sliding latch is disposed at an outer side of each of the side walls. Each of the two inner walls is disposed at the outer side of the corresponding one of the two side walls. Each of the inner rails is disposed with a through slot corresponding to the sliding latch. The through slot extends longitudinally along the inner rail. The sliding latch is inserted in the through slot to be movable along the through slot. The two outer rails receive the two inner rails respectively, and each of the inner rails is movable outwardly from one end of the corresponding outer rail.

17 Claims, 8 Drawing Sheets

SERVER CHASSIS

TECHNICAL FIELD

The present invention relates to a server chassis and, in particular, to a server chassis providing an additional movement course.

BACKGROUND

The present server equipment normally includes server cabinets and multiple drawers superposed in the server cabinet. The drawer usually is a chassis for accommodating a host computer or hard disks. The drawer can be pulled out for maintenance. Since the drawer is heavy after being loaded with the hard disks, a slide rail is utilized between the drawer and an inner surface of the server chassis to facilitate the drawer's movement. A common slide rail includes an inner rail and an outer rail engaged with each other, and the outer rail has rollers disposed inside for contacting the inner rail, thereby reducing a resistance force against relative movement between the inner rail and the outer rail. A course of movement of the drawer is limited by length of the outer rail. Normally, the inner rail and the outer rail of the drawer match the depth of the drawer to obtain a longest course of movement. Nevertheless, the inner rail still cannot be completely detached from the outer rail, so when the drawer is pulled out to a farthest point of movement, the rearmost portion of the drawer is still covered by the other drawer superposed thereon, and consequently, maintenance is inconvenient and troublesome.

Accordingly, the inventor made various studies to solve the above-mentioned problems, on the basis of which the present invention is accomplished.

SUMMARY

The present invention provides a server chassis having an additional movement course.

The present invention provides a server chassis. The server chassis includes a tray, two inner rails and two outer rails. The tray includes a bottom plate. Two opposite side walls extend from an edge of the bottom plate, and a sliding latch is protrudingly disposed at an outer side of each of the side walls. Each of the two inner rails is disposed at the outer side of the corresponding one of the two side walls. Each of the inner rails includes a through slot corresponding to the sliding latch. The through slot extends longitudinally along the inner rail, and the sliding latch is inserted in the through slot to be movable along the through slot. The two outer rails receive the two inner rails respectively, and each of the inner rails is movable outwardly from one end of the corresponding outer rail.

In the server chassis of the present invention, a block flexible arm is disposed on the outer side of at least one of the side walls. A distal end of the block flexible arm bends to form a retaining wall for blocking the inner rail. The block flexible arm is disposed on one end of the side wall and extends toward the other end of the side wall. The block flexible arm extends toward the sliding latch. The inner rail includes an assembly hole communicating with one end of the through slot, and a diameter of the assembly hole is greater than a width of the through slot. A distal end of the sliding latch is disposed with a stop portion, and an outer diameter of the stop portion is between the diameter of the assembly hole and the width of the through slot. A distance between the distal end of the block flexible arm and the sliding latch is equal to or smaller than a length of the through slot. When the inner rail moves out from the outer rail and the tray moves out from the inner rail to cause the sliding latch to be positioned on the other end of the through slot, the tray is positioned beyond length of the outer rail.

According to the server chassis of the present invention, the outer rail includes a guide plate, the guide plate is of a long strip shape, two sides of the guide plate are disposed with two troughs arranged opposite to each other in parallel and spaced apart relationship, and two slide sleeves opposite to each other are disposed in the two troughs respectively, each of the slide sleeves protrudes from an inner surface of the corresponding trough. Two lateral edges of the inner rail are inserted into the two slide sleeves, respectively. Each of the slide sleeves includes an engagement latch, and the engagement latch is engaged with the guide plate.

According to the server chassis of the present invention, each of the slide sleeves forms a recess portion, and each of the recess portions is attached to an inner surface of the corresponding trough. Two lateral edges of the inner rail are inserted in the two recess portions, respectively. Each of the slide sleeves includes a positioning plate extending from the recess portion, an engagement latch is formed on the positioning plate, and the engagement latch is engaged with the guide plate. The guide plate includes a fastening hole corresponding to the engagement latch, and the engagement latch is engaged in the fastening hole.

The server chassis of the present invention provides an additional movement course for the tray, so that the tray can be pulled out of a server cabinet or the server chassis.

BRIEF DESCRIPTION OF THE DRAWINGS

The disclosure will become more fully understood from the detailed description and the drawings given herein below for illustration only, and thus does not limit the disclosure, wherein.

DETAILED DESCRIPTION

Figure 1:
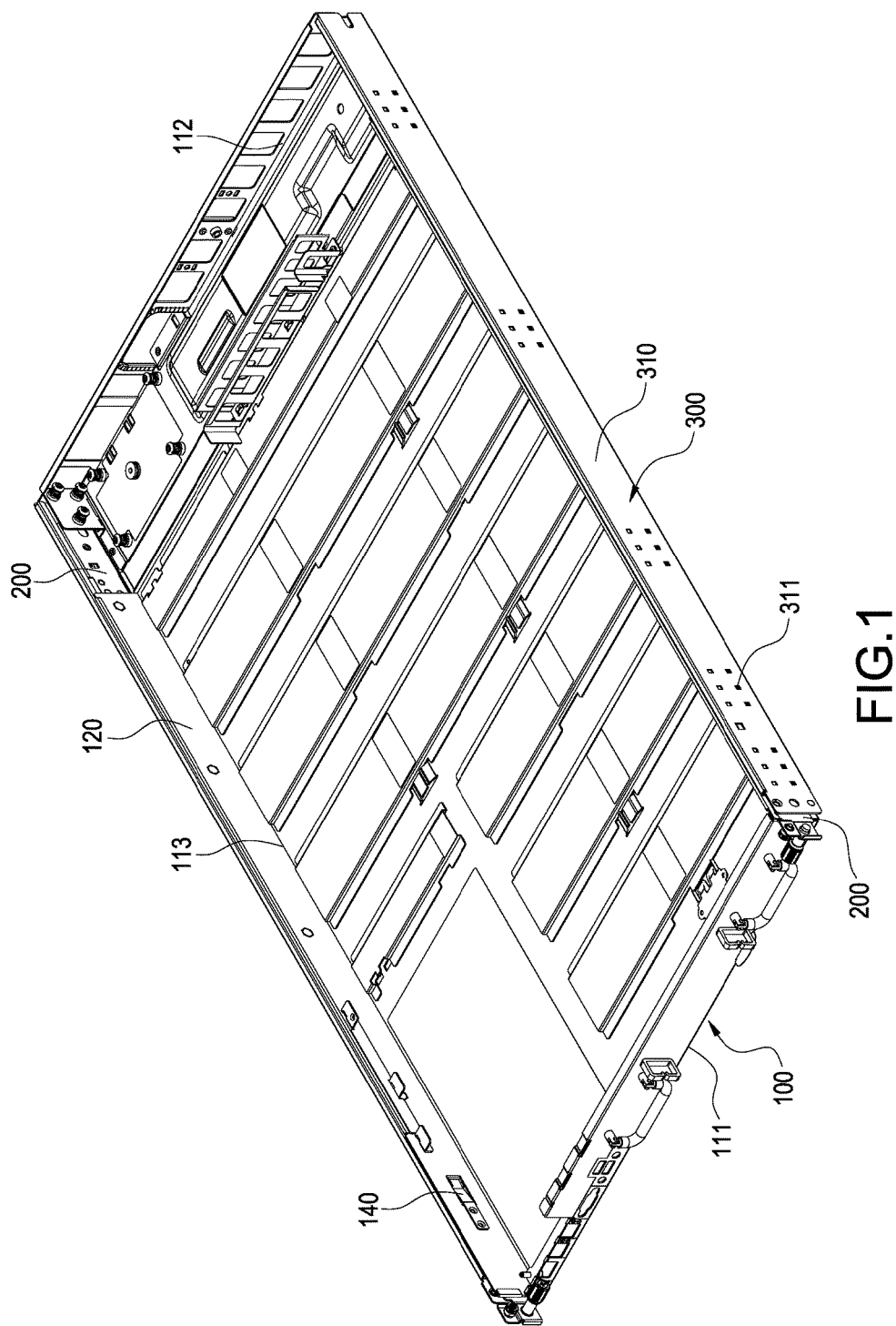
FIG. 1 is a perspective view illustrating a server chassis according to a preferable embodiment of the present invention.
Figure 2:
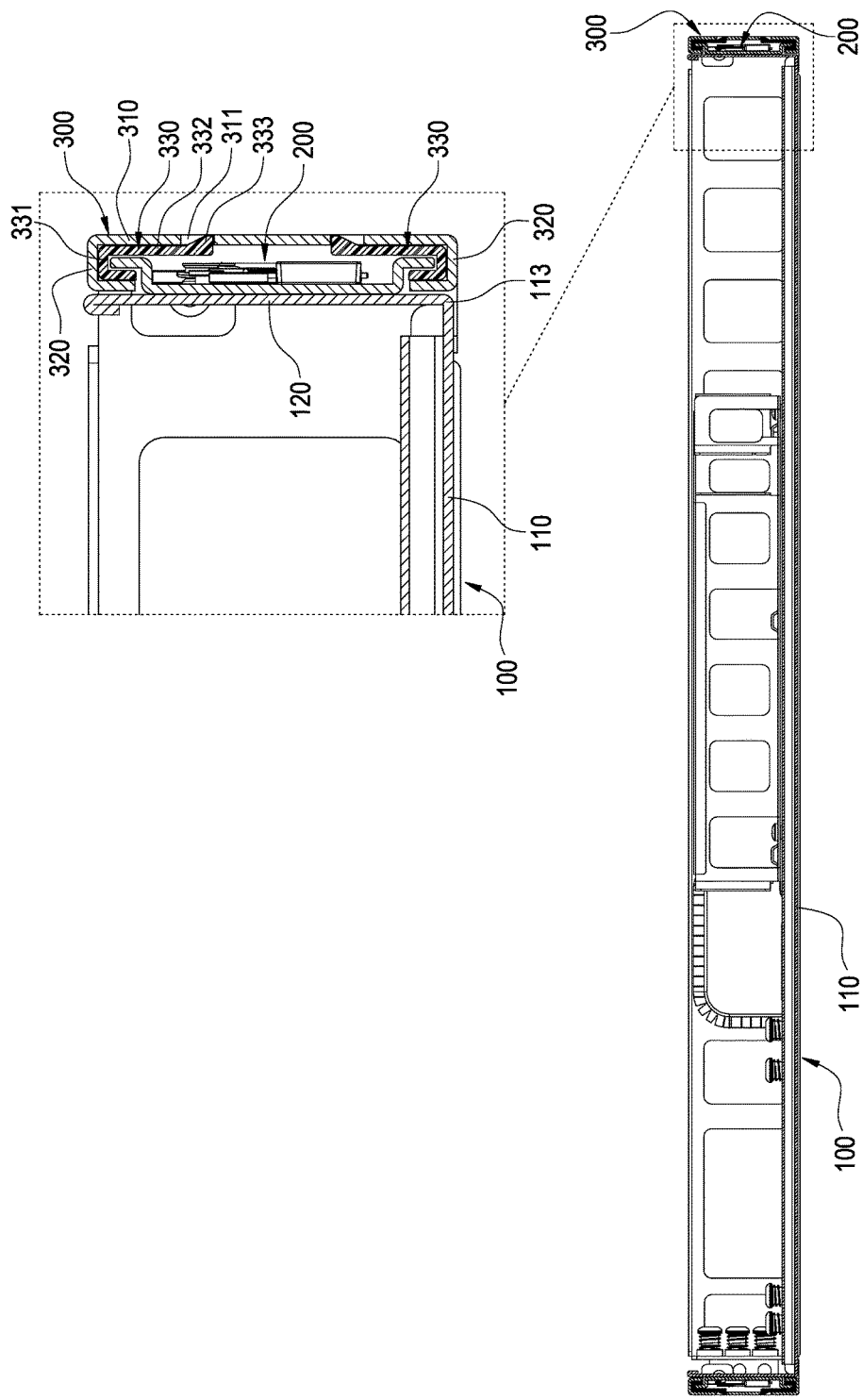
FIG. 2 is a partial cross-sectional view illustrating the server chassis according to the preferable embodiment of the present invention.
Figure 6:
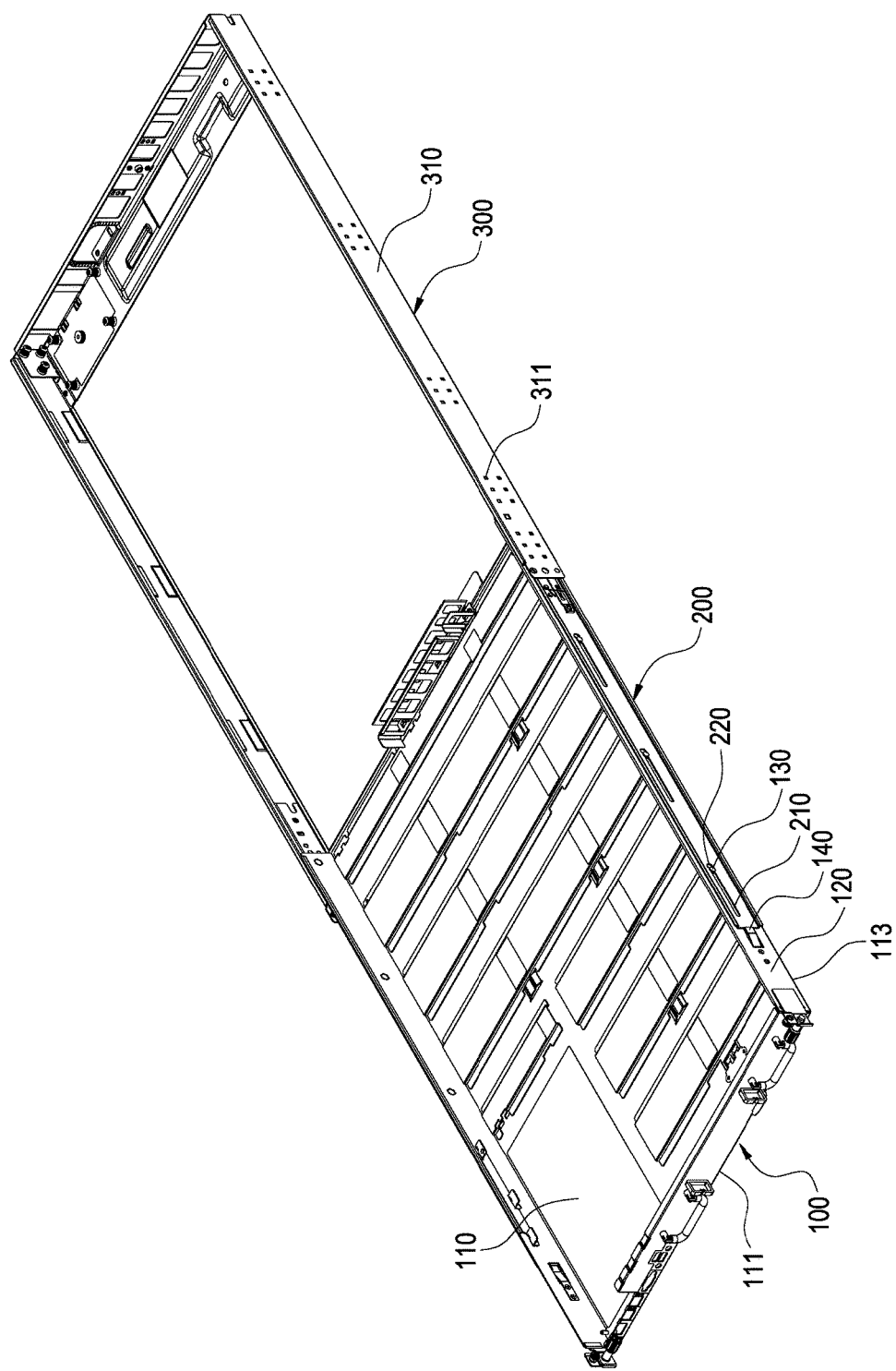
FIG. 6 is a motion view illustrating the server chassis according to the preferable embodiment of the present invention.

Please refer to FIGS. 1, 2 and 6, illustrating a server chassis according to a preferable embodiment of the present invention. The server chassis includes a tray 100, two inner rails 200 and two outer rails 300. The server chassis is disposed in a server cabinet or a server rack for supporting hard disks.

Figure 3:
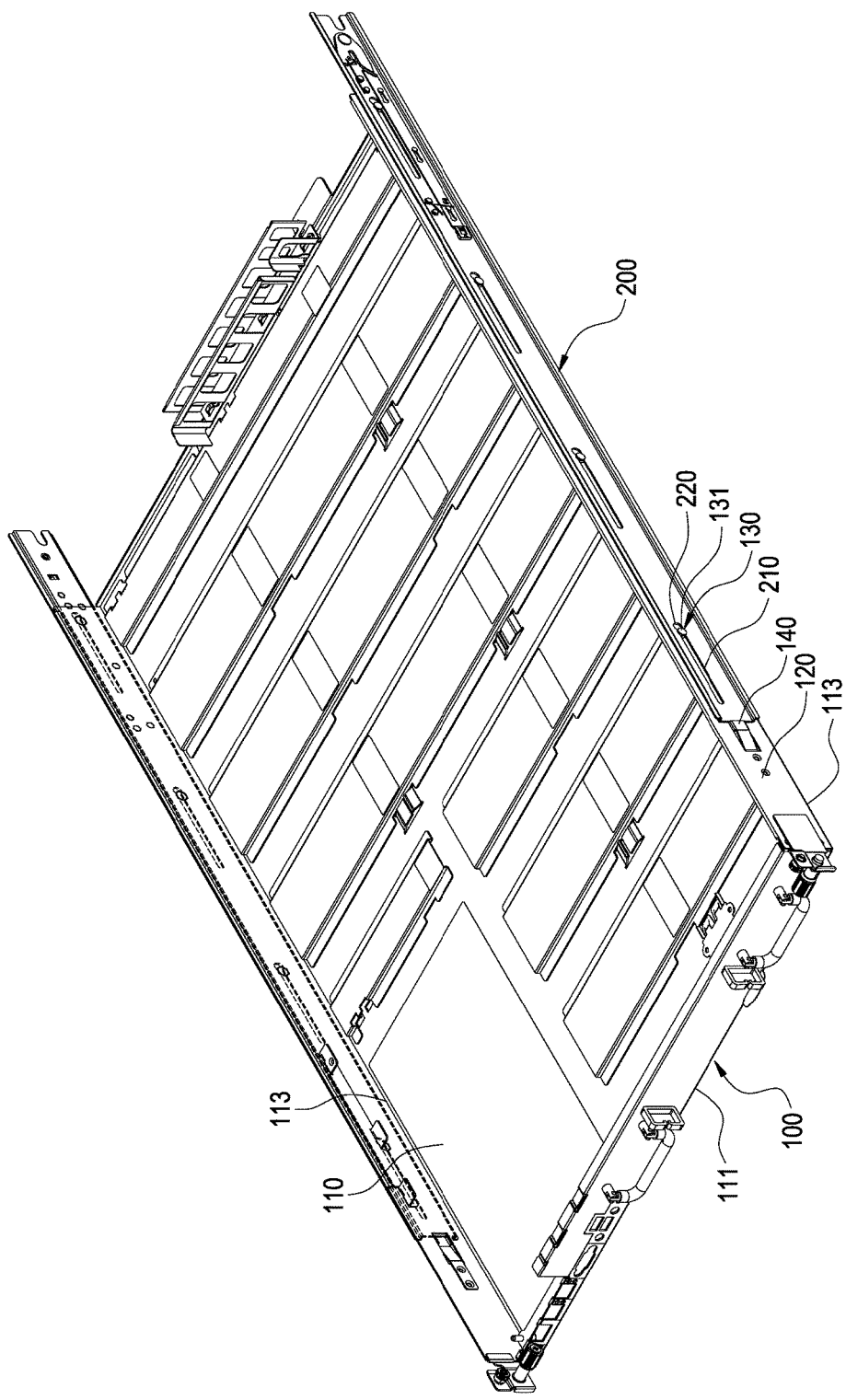
FIG. 3 is a schematic view illustrating arrangement of an inner rail in the server chassis according to the preferable embodiment of the present invention.
Figure 4:
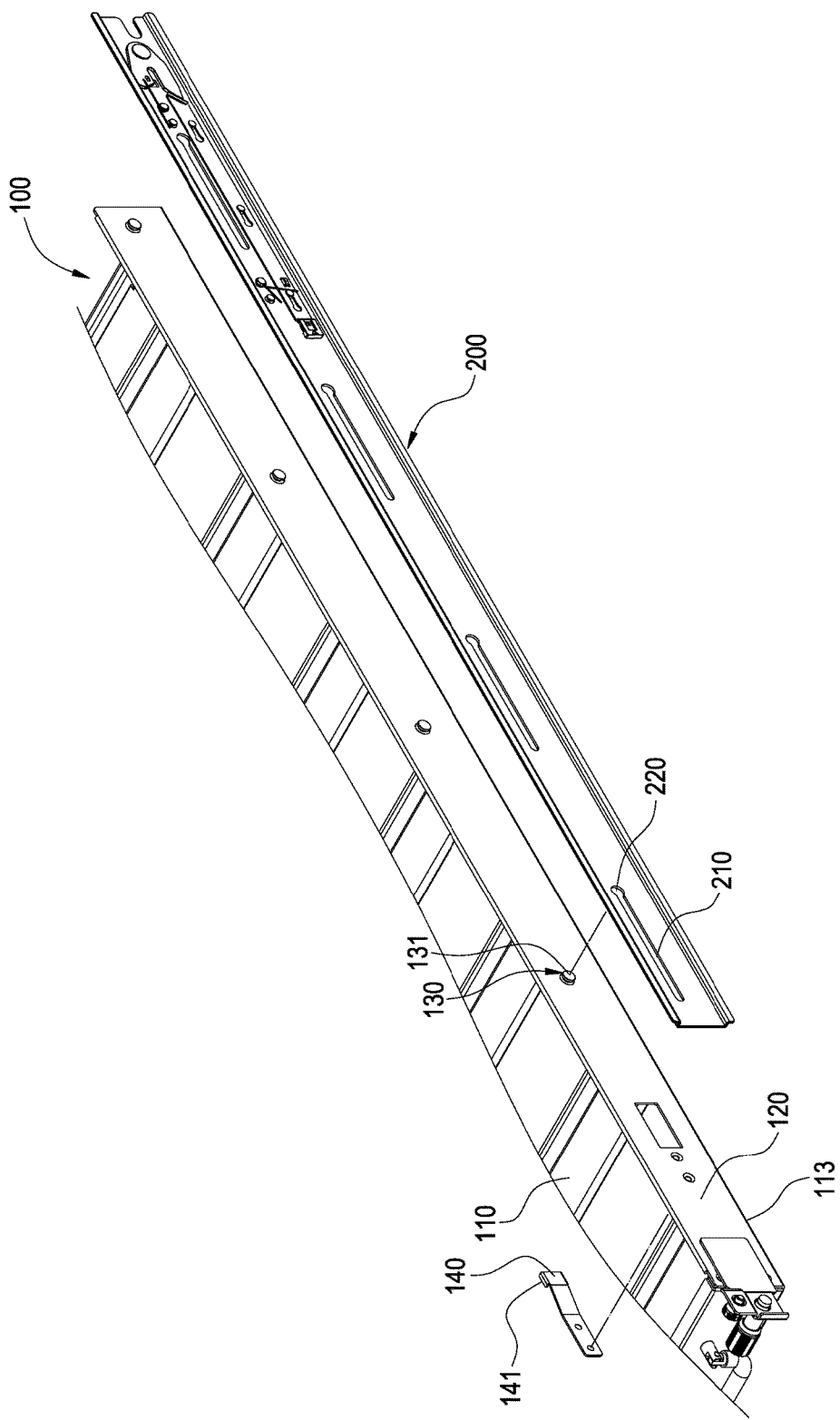
FIG. 4 is a partial exploded view illustrating the server chassis according to the preferable embodiment of the present invention.
Figure 5:
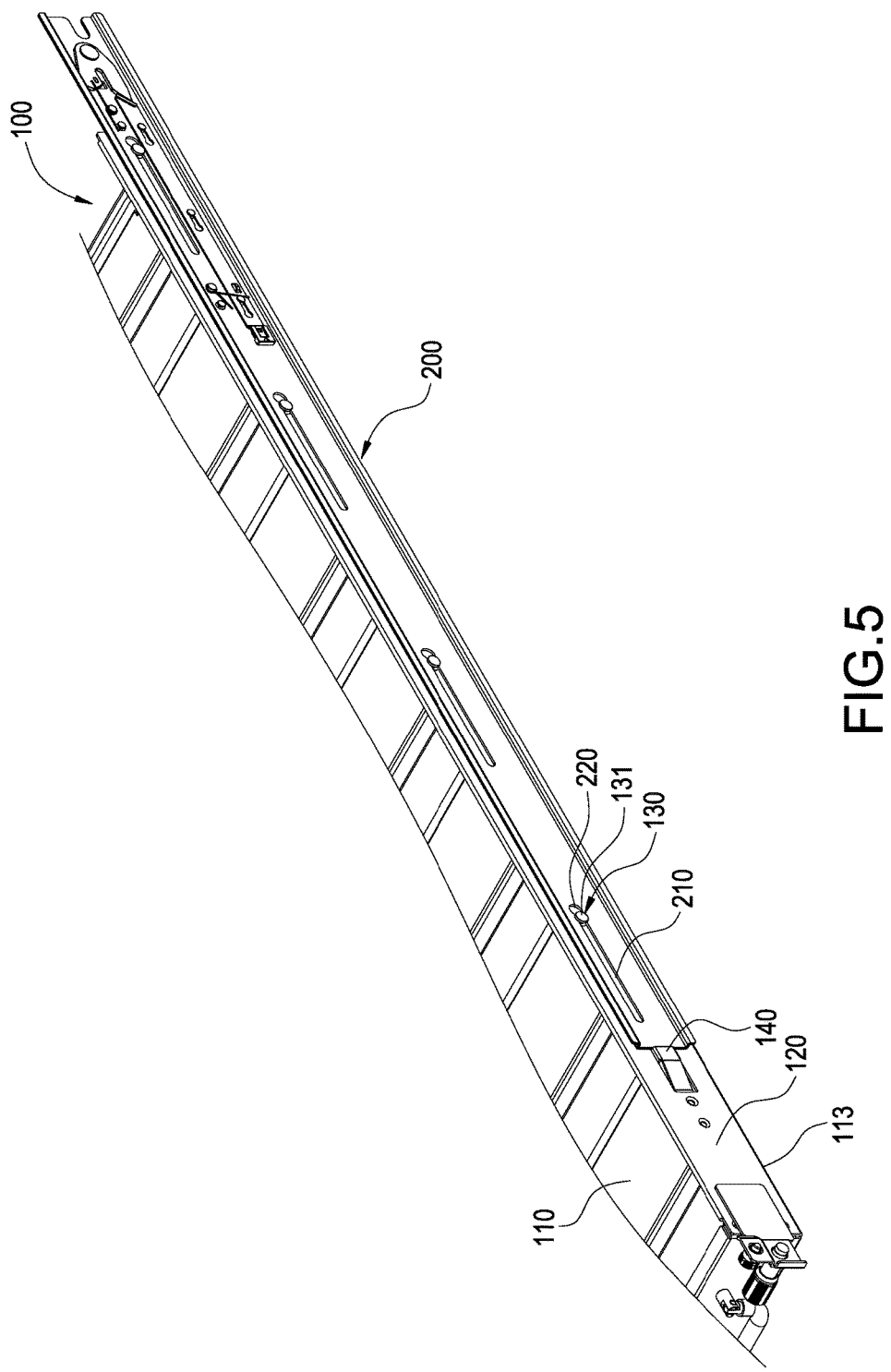
FIG. 5 is a partial enlarged view of FIG. 3.

Referring to FIGS. 1 to 3, the tray 100 includes a bottom plate 110 for supporting the hard disks. According to the present embodiment, it is preferable that the bottom plate 110 is of a rectangular shape. The bottom plate 110 includes a front edge 111, a rear edge 112 opposite thereto, and two side edges 113 extending between the front edge 111 and the rear edge 112. A side wall 120 perpendicular to the bottom plate 110 extends from each side edge 113. At least one sliding latch 130 is protrudingly disposed at an outer side of each of the side walls 120. In the present embodiment, it is preferable that multiple sliding latches 130 are protrudingly disposed on the outer side of each of the side walls 120, a distal end of the sliding latch 130 is disposed with a stop portion 131. A block flexible arm 140 is disposed on the outer side of at least one of the side walls 120. In the present embodiment, each of the side walls 120 is disposed with a block flexible arm 140 on its outer side. The block flexible arm 140 is disposed on one end of the side wall 120 and extends toward the other end of the side wall 120. It is preferable that the block flexible arm 140 extends toward the sliding latches 130 on the corresponding side wall 120.

Referring to FIGS. 2 to 5, each of the two inner rails 200 is disposed at the outer side of the corresponding one of the two side walls 120 on the tray 100. In the present embodiment, each inner rail 200 has a long strip shape. Each of the inner rails 200 includes at least one through slot 210, and in the present embodiment, there are multiple through slots respectively corresponding to the sliding latches 130 on the corresponding side wall 120. The through slot 210 extends longitudinally along the corresponding inner rail 200. Each sliding latch 130 is inserted in the corresponding through slot 210 to be movable along the through slot 210, and thereby each of the inner rails 200 is movably disposed on the outer side of the corresponding side wall 120 on the tray 100. A distance between a distal end of the block flexible arm 140 and the closest sliding latch 130 is equal to or smaller than a length of the through slot 210 where the closest sliding latch 130 is. A distal end of the block flexible arm 140 bends to form a retaining wall 141 for blocking the inner rail 200, thereby limiting a relative movement between the tray 100 and the inner rail 200. Each inner rail 200 includes an assembly hole 220 communicating with one end of the corresponding through slot 210. In this embodiment, there are multiple assembly holes communicating with the through slots 210, respectively, and a diameter of the assembly hole 220 is greater than a width of the through slot 210. The assembly hole 220 penetrates one end which is away from the block flexible arm 140. An outer diameter of the stop portion 131 of the sliding latch 130 is between the diameter of the assembly hole 220 and the width of the through slot 210, so the stop portion 131 can pass through the assembly hole 220. When the stop portion 131 passes through the assembly hole 220, the inner rail 200 compresses the block flexible arm 140. When the sliding latch 130 moves into the through slot 210, the block flexible arm 140 rebounds, so that the sliding latch 130 cannot move back into the assembly hole 220, and thereby movement of the sliding latch 130 is limited within the through slot 210; the stop portion 131 is blocked by an inner edge of the through slot 210 to prevent the inner rail 200 from detached or falling off from the tray 100.

Referring to FIGS. 1, 2 and FIGS. 6 to 8, the outer rail 300 is used to connect a server cabinet or an inner side of a server rack, so as to fix the tray 100 in the server cabinet or the server rack. In the present embodiment, the two outer rails 300 have the same structure. Each outer rail 300 receives the corresponding inner rail 200. Each inner rail 200 is movable outwardly from one end of the corresponding outer rail 300. The outer rail 300 includes a guide plate 310, and the guide plate 310 is of a long strip shape. Two troughs 320, disposed opposite to each other in parallel and spaced apart relationship, extend from edges of two sides of the guide plate 310. In each trough 320, there is at least one slide sleeve 330 corresponding to the slide sleeve 330 in the other trough 320. In the present embodiment, each trough 320 has multiple slide sleeves 330 disposed inside. The slide sleeve 330 is made of plastic. Each of the slide sleeves 330 forms a recess portion 331. Each of the recess portions 331 is attached to an inner surface of the corresponding trough 320. Each of the slide sleeves 330 protrudes from an inner surface of the corresponding trough 320. Each of the slide sleeves 330 includes a positioning plate 332 extending from the recess portion 331, and at least one engagement latch 333 is formed on the positioning plate 332. In the present embodiment, each positioning plate 332 preferably includes multiple engagement latches 333 formed thereon. To each of the engagement latches 333, the guide plate 310 has a fastening hole 311 formed corresponding to it. When assembling, an operator first places the recess portion 331 in the corresponding trough 320, then presses the positioning plate 332 to fasten each engagement latch 333 in the respective corresponding fastening hole 311, and thus the slide sleeve 330 can be assembled in the outer rail 300 with ease.

Referring to FIG. 2, an edge of each of two sides of the inner rail 200 is inserted in the corresponding recess portion 331, and therefore does not contact the inner surface of the trough 320 of the outer rail 300. Since plastic provides a smaller surface frictional force than metal, the inner rail 200 tends to slide with respect to the outer rail 300. In addition to the course of movement of the inner rail 200 with respect to the outer rail 300, the through slot 210 of the inner rail 200 permits the tray 100 to move with respect to the inner rail 200, thus providing an additional course of movement for the tray 100 without the need for adding additional components/parts.

Figure 7:
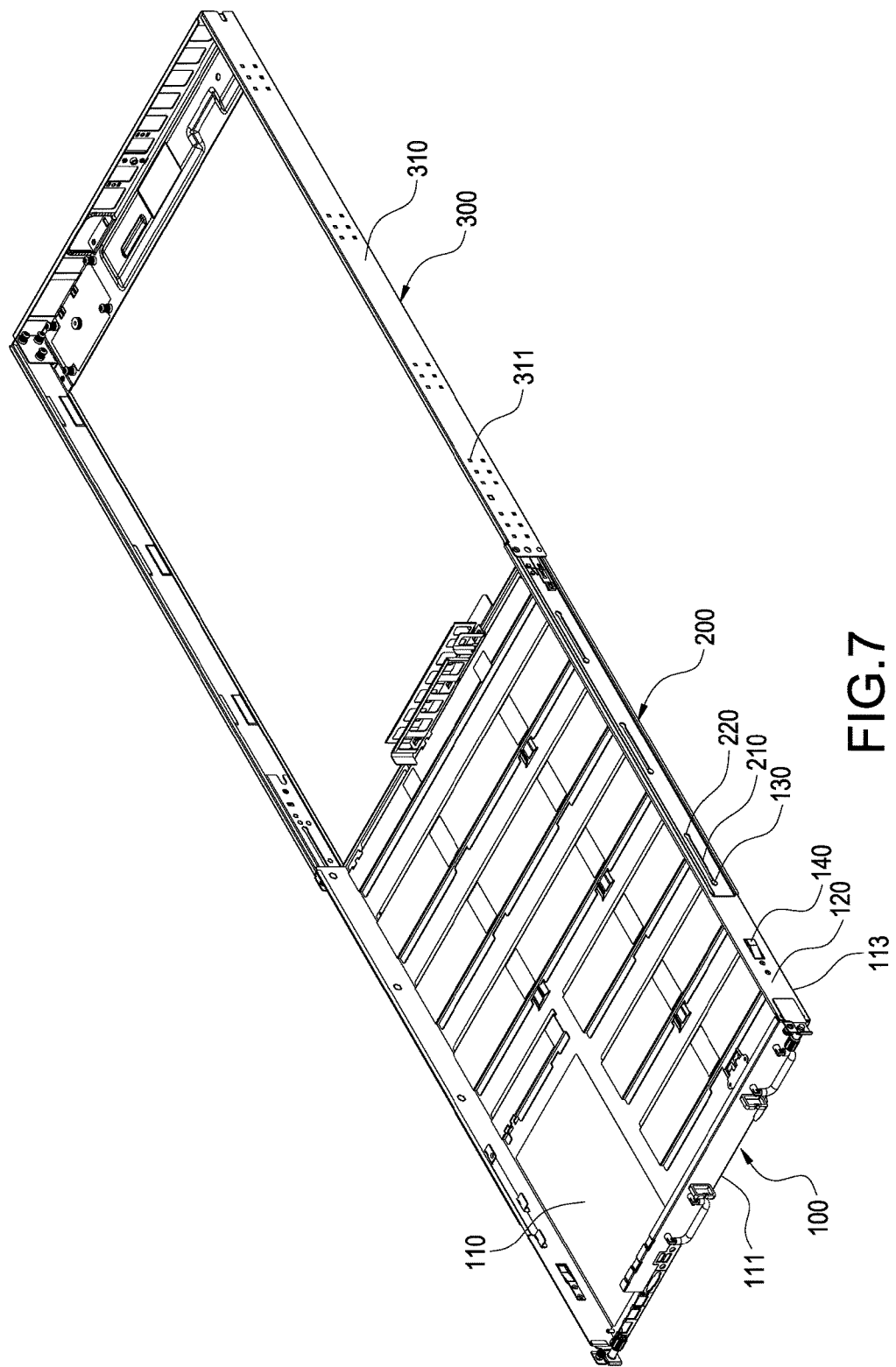
FIG. 7 is another motion view illustrating the server chassis according to the preferable embodiment of the present invention.
Figure 8:
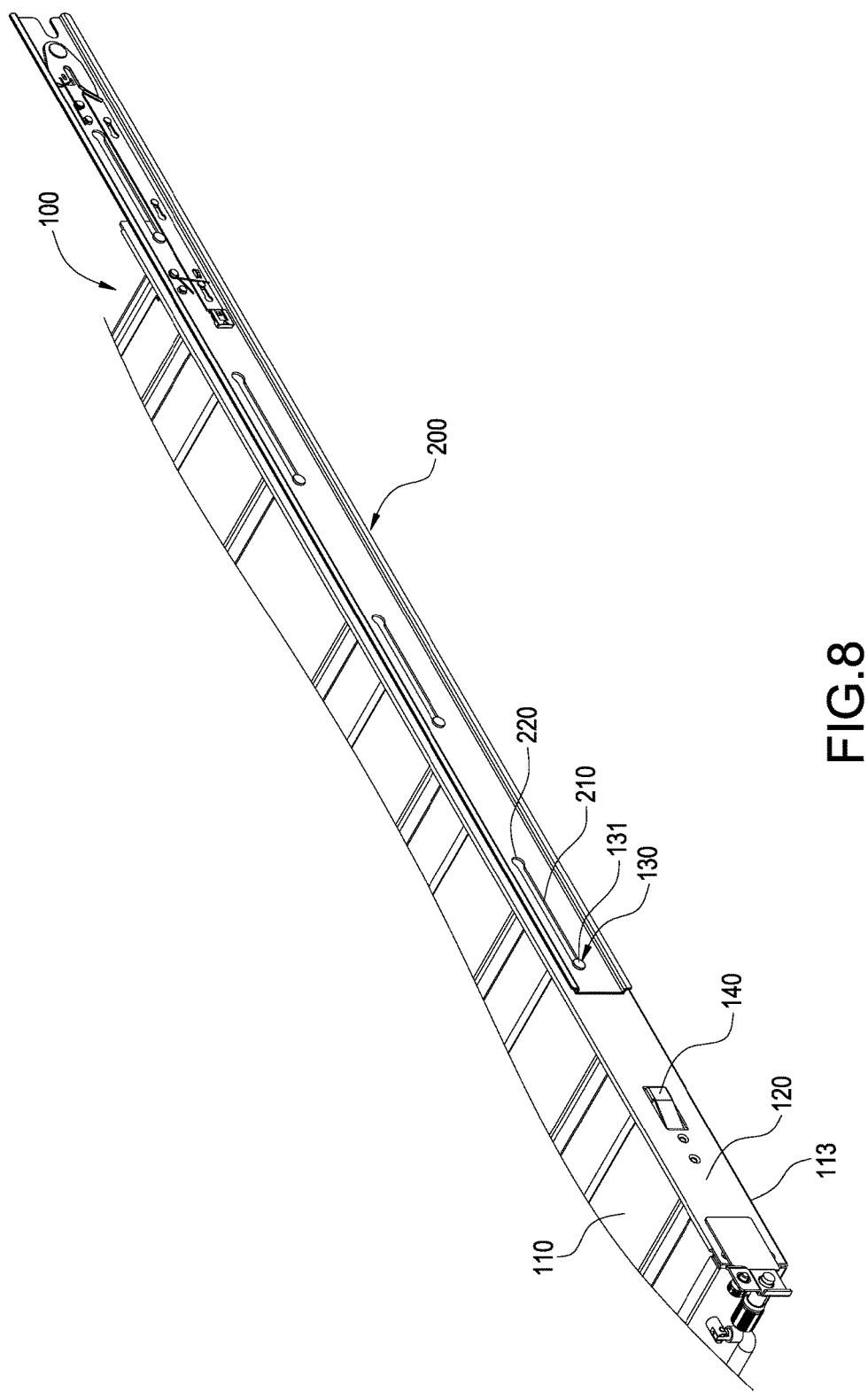
FIG. 8 is a partial enlarged view of FIG. 7.

Referring to FIGS. 6 to 8, when the inner rail 200 moves out of the outer rail 300, and the tray 100 is pulled out of the inner rail 200 to make the sliding latch 130 to be disposed at one end of the through slot 210 away from the assembly hole 220, the tray 100 is separated from the outer rail 300 and is positioned beyond length of the outer rail 300. Therefore, the tray is pulled out entirely for maintenance.

Furthermore, by means of the plastic slide sleeve 330, the inner rail 200 can move easily with respect to the outer rail 300. As a result, there is no need to install large-sized and expensive rollers in the outer rail 300, thereby reducing costs and facilitating simple assembly.

It is to be understood that the above descriptions are merely the preferable embodiment of the present invention and are not intended to limit the scope of the present invention. Equivalent changes and modifications made in the spirit of the present invention are regarded as falling within the scope of the present invention.

What is claimed is:
1. A server chassis, comprising:
a tray, the tray including a bottom plate, two opposite side walls extending from an edge of the bottom plate, a sliding latch being protrudingly disposed at an outer side of each of the side walls;
two inner rails, each of the two inner rails being disposed at the outer side of the corresponding one of the two side walls, each of the inner rails including a through slot corresponding to the sliding latch, the through slot extending longitudinally along the inner rail, the sliding latch being inserted in the through slot to be movable along the through slot; and two outer rails, the two outer rails receiving the two inner rails respectively, each of the inner rails being movable outwardly from one end of the corresponding outer rail, wherein a block flexible arm is disposed on the outer side of at least one of the side walls.

2. The server chassis of claim 1, wherein a distal end of the block flexible arm bends to form a retaining wall for blocking the inner rail.

3. The server chassis of claim 1, wherein the block flexible arm is disposed on one end of the side wall and extends toward the other end of the side wall.

4. The server chassis of claim 3, wherein the block flexible arm extends toward the sliding latch.

5. The server chassis of claim 3, wherein the inner rail includes an assembly hole communicating with one end of the through slot, and a diameter of the assembly hole is greater than a width of the through slot.

6. The server chassis of claim 5, wherein a distal end of the sliding latch is disposed with a stop portion, and an outer diameter of the stop portion is between the diameter of the assembly hole and the width of the through slot.

7. The server chassis of claim 5, wherein a distance between a distal end of the block flexible arm and the sliding latch is equal to or smaller than a length of the through slot.

8. The server chassis of claim 5, wherein when the inner rail moves out from the outer rail and the tray moves out from the inner rail to cause the sliding latch to be positioned on the other end of the through slot, the tray is positioned beyond length of the outer rail.

9. The server chassis of claim 1, wherein the outer rail includes a guide plate, the guide plate is of a long strip shape, two sides of the guide plate are disposed with two troughs arranged opposite to each other in parallel and spaced apart relationship, and two slide sleeves opposite to each other are disposed in the two troughs respectively; each of the slide sleeves protrudes from an inner surface of the corresponding trough.

10. The server chassis of claim 9, wherein two lateral edges of the inner rail are inserted into the two slide sleeves, respectively.

11. The server chassis of claim 9, wherein each of the slide sleeves includes an engagement latch, and the engagement latch is engaged with the guide plate.

12. The server chassis of claim 9, wherein each of the slide sleeves forms a recess portion, and each of the recess portions is attached to the inner surface of the corresponding trough.

13. The server chassis of claim 12, wherein two lateral edges of the inner rail are inserted in the two recess portions, respectively.

14. The server chassis of claim 12, wherein each of the slide sleeves includes a positioning plate extending from the recess portion, an engagement latch is formed on the positioning plate, and the engagement latch is engaged with the guide plate.

15. The server chassis of claim 14, wherein the guide plate includes a fastening hole corresponding to the engagement latch, and the engagement latch is engaged in the fastening hole.

16. A server chassis, comprising:

a tray, the tray including a bottom plate, two opposite side walls extending from an edge of the bottom plate, a sliding latch being protrudingly disposed at an outer side of each of the side walls;

two inner rails, each of the two inner rails being disposed at the outer side of the corresponding one of the two side walls, each of the inner rails including a through slot corresponding to the sliding latch, the through slot extending longitudinally along the inner rail, the sliding latch being inserted in the through slot to be movable along the through slot; and two outer rails, the two outer rails receiving the two inner rails respectively, each of the inner rails being movable outwardly from one end of the corresponding outer rail, wherein the outer rail includes a guide plate, the guide plate is of a long strip shape, two sides of the guide plate are disposed with two troughs arranged opposite to each other in parallel and spaced apart relationship, and two slide sleeves opposite to each other are disposed in the two troughs respectively; each of the slide sleeves protrudes from an inner surface of the corresponding trough;

wherein each of the slide sleeves includes an engagement latch, and the engagement latch is engaged with the guide plate.

17. A server chassis, comprising:

a tray, the tray including a bottom plate, two opposite side walls extending from an edge of the bottom plate, a sliding latch being protrudingly disposed at an outer side of each of the side walls;

two inner rails, each of the two inner rails being disposed at the outer side of the corresponding one of the two side walls, each of the inner rails including a through slot corresponding to the sliding latch, the through slot extending longitudinally along the inner rail, the sliding latch being inserted in the through slot to be movable along the through slot; and two outer rails, the two outer rails receiving the two inner rails respectively, each of the inner rails being movable outwardly from one end of the corresponding outer rail, wherein the outer rail includes a guide plate, the guide plate is of a long strip shape, two sides of the guide plate are disposed with two troughs arranged opposite to each other in parallel and spaced apart relationship, and two slide sleeves opposite to each other are disposed in the two troughs respectively; each of the slide sleeves protrudes from an inner surface of the corresponding trough;

wherein each of the slide sleeves forms a recess portion, and each of the recess portions is attached to the inner surface of the corresponding trough;

wherein each of the slide sleeves includes a positioning plate extending from the recess portion, an engagement latch is formed on the positioning plate, and the engagement latch is engaged with the guide plate.

* * * * *